United States Patent [19]
Szmanda et al.

[11] Patent Number: 5,866,299
[45] Date of Patent: Feb. 2, 1999

[54] NEGATIVE PHOTORESIST COMPOSITION

[75] Inventors: Charles R. Szmanda, Westborough; Peter Trefonas, III, Medway, both of Mass.

[73] Assignee: Shipley Company, L.L.C., Marlborough, Mass.

[21] Appl. No.: 877,882

[22] Filed: Jun. 18, 1997

[51] Int. Cl.$^6$ ........................................... G03C 5/00
[52] U.S. Cl. ..................... 430/281.1; 430/270.1; 430/325; 430/920
[58] Field of Search .................. 430/270.1, 326, 430/281.1, 920

[56] References Cited

U.S. PATENT DOCUMENTS

| | | | |
|---|---|---|---|
| 3,954,475 | 5/1976 | Bonham et al. | 96/67 |
| 3,987,307 | 10/1976 | Giconi | 290/1 D |
| 4,189,323 | 2/1980 | Buhr | 430/281 |
| 5,128,232 | 7/1992 | Thackeray et al. | 430/192 |
| 5,525,453 | 6/1996 | Przybilla et al. | 430/170 |
| 5,609,989 | 3/1997 | Bantu et al. | 430/270.1 |
| 5,663,035 | 9/1997 | Masuda et al. | 430/270.1 |
| 5,733,705 | 3/1998 | Bantu et al. | 430/270.1 |

FOREIGN PATENT DOCUMENTS

| | | |
|---|---|---|
| 0 485 325 A1 | 5/1992 | European Pat. Off. . |
| 0 519 298 A1 | 12/1992 | European Pat. Off. . |
| 0 621 508 A1 | 10/1994 | European Pat. Off. . |

*Primary Examiner*—Janet Baxter
*Assistant Examiner*—Rosemary Ashton
*Attorney, Agent, or Firm*—Robert L. Goldberg; Peter F. Corless; Darryl P. Frickey

[57] ABSTRACT

A photoresist composition and process that minimizes the effect of photogenerated acid migration. The photoresist comprises an alkali soluble resin, a photoacid generating compound that undergoes photolysis within a wavelength of from 330 to 700 nm to yield a strong acid, a crosslinking agent capable of crosslinking the composition when activated by photogenerated hydrohalide acid and a buffer comprising a mixture of an organic carboxylic acid and a strong base having a $pK_b$ of 5 or less present in a concentration sufficient to immobilize from 0.1 to 25 mole percent of photogenerated acid. The buffer is responsible for immobilization of the acid.

25 Claims, No Drawings

NEGATIVE PHOTORESIST COMPOSITION

BACKGROUND OF THE INVENTION

1. Field of the Invention

This invention relates to acid hardened photoresist compositions particularly suitable for i-line and g-line exposure and characterized by the presence of a buffer to neutralize strong photogenerated hydrohalide acids.

2. Description of the Prior Art

Photoresists are photosensitive films used to transfer images to a substrate. They are applied as liquid coatings to a substrate and dried to provide a film. After forming the film on the substrate, the film is exposed through a patterned photomask to a source of activating energy such as ultraviolet light to form a latent image. The photomask has areas opaque to activating radiation and other areas transparent to activating radiation. The pattern in the photomask of opaque and transparent areas defines a desired image that may be used to transfer the image to a substrate. A relief image is provided by development of the latent image pattern in the resist coating. The use of photoresist coatings is generally described, for example, by DeForest, Photoresist Materials and Processes, McGraw Hill Book Company, New York (1975), and by Moreau, Semiconductor Lithography, Principals, Practices and Materials, Plenum Press, New York (1988).

Known photoresist compositions can provide positive or negative imaged features having a resolution and size sufficient for many existing commercial applications. However, for many other applications, the need exists for new photoresists that can provide more highly resolved images of submicron dimension. It has been found in the art that to obtain submicron resolution, it is necessary to irradiate the photoresist with activating radiation at short wavelengths such as deep ultraviolet (DUV) or x-ray. Though photoresists are known that are responsive to short wave length exposures, most imaging equipment currently in use is capable of exposing the photoresist coating at the higher g-line and i-line wavelengths.

Photoresist compositions capable of imaging by DUV exposure include acid hardened photoresists such as those photoresist compositions disclosed by Feely in U.S. Pat. No. 5,034,304 incorporated herein by reference. An improvement to acid hardened photoresist compositions is disclosed in U.S. Pat. No. 5,128,232 to Thackeray et al. The DUV photoresists that are the subject of these patents typically comprise an alkali soluble phenolic resin, a photoacid generator that liberates acid upon exposure to activating radiation and an acid activated crosslinking or hardening agent whereby, upon exposure to DUV irradiation, the photoacid generator undergoes photolysis liberating acid that induces crosslinking and hardening of the photoresist coating in the exposed areas of the coating. The Feely patent discloses resin binders inclusive of phenolic resins. The Thackeray et al. patent is an improvement over Feely in that it discloses the use of resin binders that are copolymers of phenols and cyclic alcohols.

Acid hardening photoresist compositions such as those disclosed in the Feely and Thackeray et al. patents provide fine line, high resolution images. However, imaging equipment most prevalent in the industry is adapted for i-line or g-line exposure and the acid hardening resist compositions are insensitive at these exposure wavelengths. Consequently, efforts have been made in the industry to formulate acid hardening photoresist compositions that may be imaged by i-line and g-line exposure.

In U.S. Pat. Nos. 3,954,475 and 3,987,307, both incorporated herein by reference, there is disclosed a class of vinyl-halomethyl-s-triazine compounds capable of photolysis and halogen acid free radical generation upon excitation at a radiation within the wavelength of from about 330 to 700 nanometers, a range that includes both i-line and g-line wavelengths. It is disclosed in these patents that the described halogenated triazines may be used for formulation of light sensitive compositions. Photoresists utilizing the triazine photoacid generators have been formulated for i-line and g-line imaging. Such photoresists are disclosed in the literature, for example, in U.S. Pat. No. 4,189,323 and in European Patent Applns. 0 458 325; 0 519 298; and 0 621 509, each incorporated herein by reference. The photoresists disclosed in the patent and the European applications typically comprises an alkali soluble resin binder such as a phenolic resin, a crosslinking agent and the halomethyl triazine. In practice, it has been found that upon photolysis, the triazine liberates a strong halogen acid, but during use, the liberated acid migrates from exposed regions of a photoresist film into unexposed regions of the film. This causes crosslinking in both exposed and unexposed areas of the coating resulting in a decrease in differential solubility between exposed and unexposed regions of the coating. Decreased differential solubility makes development of the coating more difficult requiring the use of stronger developers. Use of a strong developer decreases image resolution.

SUMMARY OF THE INVENTION

The present invention provides an acid hardening photoresist composition suitable for imaging in the i-line and g-line regions. The photoresist contains as primary components an alkali soluble resin binder, a halogenated triazine photoactive generator and a crosslinking agent. The composition is characterized by addition of a pH buffer in a molar concentration sufficient to neutralize photogenerated acid migrating into the unexposed regions of an exposed photoresist film while sufficient acid is retained in exposed regions to induce crosslinking and image formation. For purposes herein, the term buffer is defined in accordance with its conventional definition as a substance which, when added to a solution, eliminates or reduces a change in hydrogen ion concentration by neutralization without changing original acidity or alkalinity.

The amount of buffer used in the composition of the invention should not exceed an amount equivalent to 25 mole percent of the photogenerated acid liberated by photolysis of the photoactive generator. Recognizing that a buffering composition is a mixture of components, in a preferred embodiment of the invention, one of the components of the buffer is a photoresist component. More preferably, the photoresist component comprising a portion of the buffer is the solvent for the photoresist, most preferably ethyl lactate which is known to in situ liberate lactic acid through a hydrolysis reaction. By making one of the photoresist components a component of the buffer, the requirement to add extraneous materials to the photoresist composition is reduced.

DESCRIPTION OF THE PREFERRED EMBODIMENTS

As described above, the photoresist composition of the invention comprises an alkali soluble resin binder, a halogenated photoactive generator, a crosslinking agent and a buffering composition.

Exemplary alkali soluble resins are novolak resins, poly (vinylphenol) resins, polystyrenes, copolymers of vinyl phenols with various acrylate monomers such as methacrylate, etc. Such binders are known to the art. Preferred resins are novolak resins, polyvinylphenol resins and mixtures of the two. The preferred novolak and poly(vinylphenol) may be in the form of copolymers with cyclic alcohols if desired as disclosed in U.S. Pat. No. 5,128,232.

Procedures for the preparation of conventional novolak and poly(vinylphenol) resins used as photoresists binders are well known in the art and disclosed in numerous publications including those discussed above. Novolak resins are the thermoplastic condensation products of a phenol and an aldehyde. Examples of suitable phenols for condensation with an aldehyde, especially formaldehyde, for the formation of novolak resins include phenol; m-cresol; o-cresol; p-cresol; 2,4-xylenol; 2,5-xylenol; 3,4-xylenol; 3,5-xylenol and thymol. An acid catalyzed condensation reaction results in the formation of a suitable novolak resin which may vary in molecular weight from about 500 to 100,000 daltons. The preferred novolak resins conventionally used for the formation of photoresists are the cresol formaldehyde condensation products.

Poly(vinylphenol) resins are thermoplastic polymers that may be formed by block polymerization, emulsion polymerization or solution polymerization of the corresponding monomers in the presence of a cationic catalyst. Vinylphenols useful for the production of poly(vinylphenol) resins may be prepared, for example, by hydrolysis of commercially available coumarin or substituted coumarins, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or non-substituted hydroxybenzaldehydes with malonic acid. Preferred poly(vinylphenol) resins prepared from such vinylphenols have a molecular weight range of from about 2,000 to about 100,000 daltons.

As noted, phenolic copolymers may be used as binders for the photoresist compositions of this invention. These copolymers comprise phenols and nonaromatic cyclic alcohols analogous in structure to the novolak resins and poly (vinylphenol) resins. These polymers may be formed in several ways. For example, in the conventional preparation of a poly(vinylphenol) resin, a cyclic alcohol may be added to the reaction mixture as a comonomer during the polymerization reaction which is thereafter carried out in normal manner. The cyclic alcohol is preferably aliphatic, but may contain one or two double bonds. The cyclic alcohol is preferably one closest in structure to the phenol reactant. For example, if the resin is a polyvinyl phenol, the comonomer would be vinyl cyclohexanol.

A preferred method for formation of the polymer comprises partial hydrogenation of a preformed novolak resin or a preformed polyvinyl phenol resin. Hydrogenation may be carried out using art recognized hydrogenation procedures; for example, by passing a solution of the phenolic resin over a reducing catalyst such as a platinum or palladium coated carbon substrate, or preferably Raney nickel, at elevated temperature and pressure. The specific conditions are dependent upon the polymer to be hydrogenated. More particularly, the polymer is dissolved in a suitable solvent such as ethyl alcohol or acetic acid, and then the so formed solution is contacted with a finely divided Raney nickel catalyst and allowed to react at a temperature of from about 100° to 300° C. at a pressure of from about 50 to 300 atmospheres or more. The finely divided nickel catalyst may be a nickel-on-silica, nickel-on-alumina, or nickel-on-carbon catalyst depending upon the resin to be hydrogenated. Hydrogenation is believed to reduce the double bonds in some of the phenolic units resulting in a random copolymer of phenolic and cyclic alcohol units in percentages dependent upon the reaction conditions used. The polymers formed by this reaction will have the following structure:

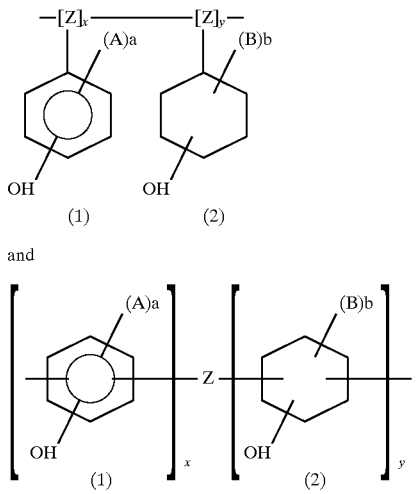

where each unit (1) represents a phenolic unit and unit (2) represents a cyclic alcohol unit; Z is an alkylene bridge having from 1 to 3 carbon atoms; A is a substituent on the aromatic ring replacing hydrogen such as lower alkyl having from 1 to 3 carbon atoms, halo such as chloro or bromo, alkoxy having from 1 to 3 carbon atoms, hydroxyl, nitro, amino, etc.; a is a number varying from 0 to 4; B is a substituent such as hydrogen, lower alkyl having from 1 to 3 carbon atoms, halo such as chloro or bromo, alkoxy having from 1 to 3 carbon atoms, hydroxyl, nitro, amino, etc. provided that at least 3 of said B substituents are hydrogen; b is an integer varying between 6 and 10; x is the mole fraction of the units (1) in the polymer which varies between 0 and 1.0, and for some applications, where the copolymer is desired, preferably varies between 0.50 and 0.99 and more preferably, between 0.70 and 0.90, and y is the mole fraction of units (2).

The alkali soluble resin may be a single resin or a mixture of resins. A mixture of resins is preferred. In addition, as is known in the art, the hydroxyl groups or either resin may be substituted with either an acid labile or an acid inert group such as a mesyl group or t-butyl acetate group. In the most preferred embodiment of the invention, the resin mixture is a polyvinylphenol resin having a minor portion of its hydroxyl groups mesylated admixed with a novolak resin. Such resin mixtures are disclosed and claimed in U.S. patent application Ser. No. (Attorney Docket 50123) assigned to the same assignee as the subject application.

In addition to the resin, the photoresist contains a photoacid generator. The photoacid generator undergoes photolysis to yield a strong halogen acid upon exposure to activating radiation, desirably at the i-line and g-line wavelengths. Suitable photoacid generators include, by way of example, 1,1-bis [p-chlorophenyl]-2,2,2-trichloroethane (DDT); 1,1-bis [p-methoxyphenyl]-2,2,2-trichloroethane; 1,2,5,6,9,10-hexa bromocyclododecane; 1,10-dibromododecane; 1,1-bis[p-chlorophenyl]-2,2-dichloroethane; 4,4'-dichloro-2-(trichloromethyl) benzhydrol or 1,1-bis(chlorophenyl)-2,2, 2-trichloroethane; hexachlorodimethyl sulfone; 2-chloro-6-(trichloromethyl) pryidine; o,o-diethyl-o-(3,5,6-trichloro-2-pyridyl)phosphorothioate; 1,2,3,4,5,6-hexachlorocyclohexane; N(1,1-bis [p-chlorophenyl]-2,2,2- trichoroethyl acetamide; tris [2,3-dibromopropyl] isocyanurate; 2,2-bis[p-chlorophenyl]-1,1-dichloroethylene; and halomethyl-s-triazines. Of the above exemplified halogenated photoacid generators, the halomethyl-s-triazines are preferred. Such compounds conform to the following formulae:

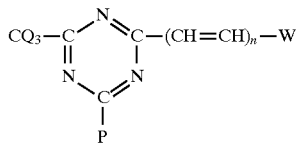

wherein Q is bromine or chlorine, P is —$CO_3H$, —$NH_2$, —NHR, —$NR_2$, or —OR where R is phenyl or lower alkyl (lower alkyl meaning an alkyl group having no more than 6 carbon atoms); n is an integer from 0 to 3; and W is $CQ_3$ or a substituted aromatic or heterocyclic nucleus or

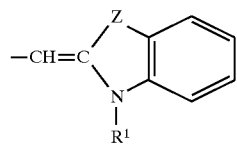

where Z is oxygen or sulfur and $R^1$ is hydrogen, a lower alkyl or phenyl group. Where W is an aromatic or heterocyclic nucleus, the ring may be optionally substituted. Without attempting an exhaustive listing of substituents, the following are noted as typical: chloro, bromo, phenyl, lower alkyl (an alkyl having no more than 6 carbon atoms), nitro phenoxy, alkoxy, acetoxy, acetyl, amino, and alkyl amino.

A preferred halomethyl-s-triazine conforms to the following structure:

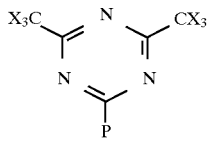

where P is as defined above and each X may be the same or different and represents a halogen atom.

The s-triazine compounds described above generate free radicals when irradiated with actinic radiation of a wavelength from about 330 to about 700 nanometers. For this reason, the compounds are useful as photoinitiators in light sensitive compositions within the i-line and g-line wavelengths.

The s-triazine compounds are condensation reaction products of certain methylhalomethyl-s-triazines and certain aldehydes or aldehyde derivatives. They may be prepared by the procedures disclosed in the above cited U.S. Pat. No. 3,954,475 and in accordance with the teachings of Wakabayashi et al., Bulletin of the Chemical Society of Japan, 42, 2924–30 (1969).

Specific examples of halogenated triazines suitable for use as photoacid generators in the invention include for example, 2-[1-(3,4-benzodioxolyl)]-4,6-bis(trichloromethyl)-1,2,5-triazine, 2-[1-(2,3-benzodioxolyl)]-4,6-bis(trichloromethyl)-1,3,5-triazine, 2-[1-(3,4-benzodioxolyl)]-4,6-bis(tribromomethyl)-1,3,5-triazine, 2-[1-(2,3-benzodioxolyl)]-4,6-bis(tribromomethyl)-1,3,5-triazine, 2-(2-furfylethylidene)-4,6-bis(trichloromethyl)-1,3,5-triazine, 2-[2-(5-methylfuryl)ethylidene]-4,6-bis(trichloromethyl)-1,3,5-triazine, 2-[2-(4-methylfuryl)ethylidene]-4,6-bis(trichloromethyl)-1,3,5-triazine, 2-[2-(3-methylfuryl)ethylidene]-4,6-bis-(trichloromethyl)-1,3,5-triazine, 2-[2-(4,5-dimethylfuryl)ethylidene]-4,6-bis(trichloromethyl)-1,3,5-triazine, 2-[2-(5-methoxyfuryl)ethylidene]-4,6-bis(trichloromethyl)-1,3,5-triazine, 2-[2-(4-methoxyfuryl)ethylidene]-4,6-bis(trichloromethyl)-1,3,5-triazine, 2-[2-(3-methoxyfuryl)ethylidene]-4,6-bis(trichloromethyl)-1,3,5-triazine, 2-[2-(4,5-dimethoxy-furyl)ethylidene]-4,6-bis(trichloromethyl)-1,3,5-triazine, 2-(2-furfylethylidene)-4,6-bis(tribromomethyl)- 1,3,5-triazine, 2-[2-(5-methylfuryl)ethylidene]-4,6-bis(tribromomethyl)j-1,3,5-triazine, 2-[2-(4-methylfuryl)-ethylidene]-4,6-bis(tribromomethyl)-1,3,5-triazine, 2-[2-(3-methylfuryl)ethylidene]-4,6-bis(tribromomethyl)-1,3,5-triazine, 2-[2-(4,5-dimethoxyfuryl)ethylidene]-4,6-bis(tribromomethyl)-1,3,5-triazine, 2-[2-(5-methoxyfuryl)ethylidene]-4,6-bis(tribromomethyl)-1,3,5-triazine, 2-[2-(4-methoxyfuryl)ethylidene]-4,6-bis (tribromomethyl)-1,3,5-triazine, 2-[2-(3-methoxyfuryl)ethylidene]-4,6-bis(tribromomethyl)-1,3,5-triazine, 2-[2-(4,5-dimethoxyfuryl)ethylidene]-4,6- bis(tribromomethyl)-1,3,5-triazine, 2,4,6-tris-(trichloromethyl)- 1,3,5-triazine, 2,4,6-tris-(tribromomethyl)-1,3,5-triazine, 2-phenyl-4,6-bis(trichloromethyl)-1,3,5-triazine, 2-phenyl-4,6-bis(tribromomethyl)-1,3,5-triazine, 2-(4-methoxyphenyl)-4,6-bis(trichloromethyl)-1,3,5-triazine, 2-(4-methoxyphenyl)-4,6-bis(tribromomethyl)-1,3,5-triazine, 2-(1-naphthyl)-4,6-bis(trichloromethyl)-1,3,5-triazine, 2-(1-naphthyl)-4, 6-bis(tribromomethyl)- 1,3,5-triazine, 2-(4-methoxy-1-naphthyl)- 4,6-bis(trichloromethyl)- 1,3,5-triazine, 2-(4-methoxy-1-naphthyl)-4,6-bis(tribromomethyl)-1,3,5-triazine, 2-(4-chlorophenyl)-4,6-bis(tribromomethyl)-1,3,5-triazine, 2-styryl-4,6-bis(trichloromethyl)-1,3,5-triazine, 2-styryl-4,6-bis(tribromomethyl)-1,3,5-triazine, 2-(4-methoxystyryl)-4,6-bis(trichloromethyl)-1,3,5-triazine, 2-(4-methoxystyryl)-4,6-bis(tribromomethyl)-1,3,5-triazine, 2-(3,4,5-trimethoxystyryl)-4,6-bis(trichloromethyl)- 1,3,5-triazine, 2-(3,4,5-trimethoxystyryl)- 4,6-bis(tribromomethyl)-1,3,5-triazine, 2-(3-chloro-1-phenyl)-4,6-bis(trichloromethyl)-1,3,5-triazine, 2-(3-chlorophenyl)-4,6-bis(tribromomethyl)-1,3,5-triazine and the like. Other triazine type photoacid generators that may be used for i-line and g-line exposure are disclosed in EP application 0,458,325.

The acid-generating s-triazines may be used alone or in admixture. The amount of acid generator may vary from about 0.01 to 5 parts by weight, preferably 0.1 to 3 parts by weight, per 100 parts by weight of the specific alkali soluble resin. When the amount of the acid-generator is less than 0.01 parts by weight, it is difficult to form a resist pattern and when the amount exceeds 5 parts by weight, the ability to strip the resist from the substrate becomes difficult.

The cross-linking agent used in this invention is preferably a compound having a methylol group and/or alkoxymethyl group that is capable of cross-linking the specific resin by heating in the presence of the photogenerated acid. When the cross-linking agent has at least two alkoxymethyl groups, each group may be the same as or different from the other.

Typical cross-linking agents include, by way of example, a urea-formaldehyde resin, a thiourea-formaldehyde resin, a melamine-formaldehyde resin, a quanamine-formaldehyde resin, a benzoguanamine-formaldehyde resin, a glycoluril-formaldehyde resin and the like. Among these cross-linking agents, particularly preferable are compounds represented by the following formulas and oligomers derived from these compounds and having a Mw of 1,500 or less:

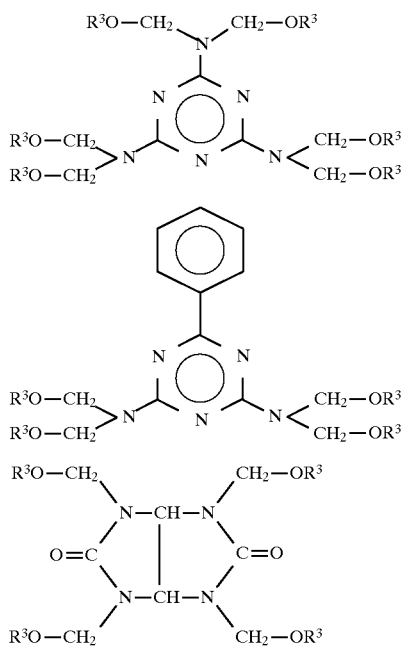

where each $R^3$ may be the same as or different and each represents a hydrogen atom or an alkyl group having 1 to 6 carbon atoms.

A number of compounds represented above are commercially available as, for example, CYMEL (a trade name of Mitsui Cyanamid Co., Ltd.) and Nikalac (a trade name of Sanwa Chemical Co., Ltd.).

The cross-linking agent may be used alone or in an admixture of cross-linking agents. The amount of cross-linking agent may vary from about 1 to 10 parts by weight and more, preferably from 1 to 7 parts by weight, per 100 parts by weight of the resin. When the amount of the cross-linking agent used is less than 1 part by weight, curing of irradiated portions of the composition becomes difficult. When the amount exceeds 10 parts by weight, strippability of the resist coating becomes difficult.

The above compositions are dissolved in a solvent to make a coating composition. The solids content may vary between 5 and 40% by weight of solids and prior to use, the compositions is preferably passed through a filter having a pore diameter of, for example, about 0.2 μm. The solvent used to prepare the composition may include, for example, methyl cellosolve, ethyl Cellosolve, methyl Cellosolve acetate, ethyl Cellosolve acetate, propylene glycol ethyl ether acetate, propylene glycol ethyl ether acetate, propylene glycol propyl ether acetate, toluene, xylene, methyl ethyl ketone, cyclohexanone, methyl 2-hydroxypropionate, ethyl 2-hydroxypropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanate, 3-methyl-3-methoxybutyl acetate, 3-methyl-3-methoxybutyl propionate, 3-methyl-3-methoxybutyl butanate, ethyl acetate, butyl acetate, methyl pyruvate, ethyl pyruvate and the like. The above solvents may be used alone or in admixture of two or more The photoresists of the invention are characterized by the use of a buffer to neutralize photogenerated hydrohalide acids migrating into unexposed regions of the photoresist film. The buffer is desirably a mixture of a weak carboxylic acid and a strong base, preferably an amine base. Any carboxylic acid may be used as the acid component of the buffer provided it is soluble in the photoresist composition. Suitable carboxylic acids include, for example, propanoic acid, butanoic acid, hexanoic acid, heptanoic acid, oxalic acid, malonic acid, succinic acid, glutaric acid, adipic acid, pimelic acid, maleic acid, lactic acid, picolinic acid, benzoic acid, salicylic acid, 2,5-dihydroxyteraphalacic acid, coumaric acid, coumarillic acid, etc.

In a preferred embodiment of the invention, the acid component of the buffer is derived from one of the photoresist components used to formulate the photoresist. In the most preferred embodiment of the invention, the acid is lactic acid present in solution as an impurity in ethyl lactate solvent. It is believed that the impurity is formed by the slow hydrolysis of ethyl lactate with the formation of lactic acid. Consequently, a preferred solvent in accordance with the invention is ethyl lactate alone or in combination with other solvents though the acid can be added to the formulation as a separate component and must be so added when the solvent or other component of the photoresist does not liberate an acid during storage.

The base portion of the buffering combination of the weak acid and the base is desirably a strong base having a $pK_b$ not exceeding 5 and preferably varying between 1 and 3. Quaternary ammonium hydroxides are preferred bases, especially quaternary ammonium hydroxides having lower alkyl substitution—i.e., alkyl groups having from 1 to 5 carbon atoms. Specific examples of such materials include tetramethyl ammonium hydroxide, tetraethyl ammonium hydroxide, tetrabutyl ammonium hydroxide, dimethyl diethyl ammonium hydroxide, etc.

The concentration of the buffer in the photoresist composition is an amount sufficient to immobilize acid migrating in unexposed regions of the photoresist film. The amount of acid migrating into the unexposed regions of the film represents a relatively small fraction of the total acid generated by photolysis of the acid generator. For this reason, the concentration of the buffer composition may be quite low, typically an amount sufficient to immobilize at least 0.1 mole percent of the photoacid generated by photolysis, but not more than 25 mole percent of the photogenerated acid and more preferably, an amount sufficient to immobilize from about 1.0 to 12 mole percent of acid generated by photolysis of the photoactive generator. One skilled in the art would determine the required amount of buffer required based upon knowledge of the amount of acid generated by photolysis and the buffering capability of the buffer selected.

Photoresist compositions of the invention are used in conventional manner. They are coated onto a substrate such as a silicon wafer such as by spin coating, roller coating or the like and dried to form a film. Thereafter, the film is irradiated through a desired pattern to form a latent image in the resist coating. The radiation used for purposes of this invention is i-line and g-line irradiation. Exposure conditions are in accordance with conventional methods used in the prior art. Following exposure, the exposed film is heat treated to cross-link the polymer which cross-linking reaction is activated by photogenerated acid. Typical heat treatment conditions may vary between 40° and 160° C. Following heat treatment, the resist film is developed with a developer such as an aqueous alkaline solution of sodium hydroxide, potassium hydroxide, sodium carbonate, triethylamine, dimethylethanolamine, triethanolamine, tetramethylammonium hydroxide, etc.

The use of the buffer of the strong base and the weak acid in accordance with the invention immobilizes acid migrating into the unexposed regions of a photoresist film. In addition, the strong base/weak acid buffer may cause a decrease in the photospeed of the photoresist, thus giving sizing photospeed closer to the most desired range. Most modern wafer steppers used in 300–450 nm exposure, especially those used at the mercury g-line (436 nm) or the mercury i-line (365 nm) will give the most reproducible and uniform exposure when the exposure dose is greater than 40 mJ/cm$^2$. The reason is largely mechanical, having to do with the stepper shutter motion combined with the high lamp intensities currently practiced. It is often quite difficult to achieve exposure precision better than 3% when the wafer plane exposure dose is less than 40 mJ/cm$^2$, and often even when the exposure dose is less than 60 mJ/cm$^2$. Thus it is desirable that the resist sizing exposure dose be greater than 40 mJ/cm$^2$, and more preferably greater than 60 mJ/cm$^2$.

An additional advantage of adding small amounts of the strong base/weak acid buffer to the photoresist is that it can allow a manufacturer to adjust the photospeed to the selected target value quite easily. At the same time, the resist performance remains constant and improved compared to the resist without such an additive. In a manufacturing operation, it is quite desirable that the lot-to-lot photospeed of the product be maintained within a narrow range, typically better than 5%, or more preferably, 3%. The rather simple addition of a carefully controlled amount of a strong base/weak acid buffer to the photoresist allows for a simplified less costly manufacturing operation with less inventory compared to other alternative methods of maintaining a constant lot-to-lot photospeed control, such as blending multiple lots of photoresist.

EXAMPLES 1–5

Varying Amount of Strong Base-Weak Acid Buffer

A solution was prepared by adding the following components together into a bottle and completely dissolving on a roller.

| | |
|---|---|
| Novolak formed from 60% p-cresol, 5.5% 2,3-xylenol, 34.5% m-cresol condensed with formaldehyde | 12.473% |
| 11% mesylated-poly(4-vinylphenol-co-4-vinylcyclohexanol, 9:1 monomer ratio) | 12.473% |
| hexamethoxymelamine isomer mixture | 3.268% |
| methoxystyrylbis(trichloromethyl)triazine | 0.287% |
| Silwet 7604 surfactant | 0.06% |
| ethyl lactate | 71.439% |
| tetrabutylammonium-lactate$^{(1)}$ | variable |

$^{(1)}$formed from adding tetrabutylammonium hydroxide to ethyl lactate

The tetrabutylammonium-lactate was formed by adding a 50% aqueous solution of tetrabutylammonium hydroxide to sufficient ethyl lactate to form a 5% solution by weight of the initial amount of tetrabutylammonium hydroxide. The amounts of tetrabutylammonium-lactate added to Examples 1–5 are shown below, in weight %, as tetrabutyl ammonium hydroxide of the solids in the solution.

| Example | Weight % as tetrabutyl ammonium hydroxide added |
|---|---|
| Comparative Example 1 | 0 |
| 2 | 0.155 |
| 3 | 0.305 |
| 4 | 0.460 |
| 5 | 0.605 |

Testing Results for Examples 1–5

A 1.03 μm film was subjected to a softbake of 110° C./60s and a post-exposure bake of 100° C./60s, exposed on a GCA 0.55NA, 0.54 σ i-line stepper and developed in 0.26N TMAH developer in a single-puddle track process at 21° C. Sizing photospeed was determined for 0.5 μm equal line/space array features. The resolution quoted is the smallest equal line/space feature size resolved with at least 90% film thickness retention and acceptable resist profile shape at the sizing photospeed. The features were free of residues and had a near-vertical wall angle. Resolution and process latitudes for examples 2–5 were excellent and significantly better than comparative example 1. This shows the addition of the strong base-weak acid buffering agent offers a significant benefit.

| Example | Clearing photospeed (mJ/cm$^2$) | Sizing photospeed (mJ/cm$^2$) | Resolution (μm) |
|---|---|---|---|
| 1 | 5 | 14 | 0.40 |
| 2 | 10 | 40 | 0.32 |
| 3 | 21 | 73 | 0.32 |
| 4 | 32 | 110 | 0.32 |
| 5 | 48 | 171 | 0.32 |

The above table illustrates the advantages of using a strong base, weak acid buffer in accordance with the procedures of the invention.

We claim:

1. A negative photoresist composition comprising an alkali soluble resin, an s-triazine photoacid generating compound that undergoes photolysis when exposed to a pattern of activating irradiation within a wavelength of from 330 to 700 nm to yield a hydrohalide strong acid, a crosslinking agent capable of crosslinking the composition when activated by photogenerated hydrohalide acid and a buffer comprising a mixture of an organic carboxylic acid and a strong base having a pK$_b$ of 5 or less, said buffer being present in a concentration sufficient to immobilize from 0.1 to 25 mole percent of the acid generated by photolysis of the s-triazine photoacid generating compound.

2. The photoresist composition of claim 1 where the acid generated is hydrochloric acid.

3. The photoresist composition of claim 1 where the s-triazine photoacid generating compound conforms to the formula:

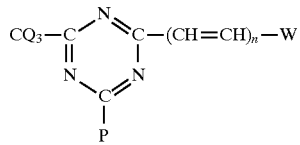

wherein Q is a halogen; P is a member selected from the group consisting of a trihalomethyl group represented by CQ$_3$, a substituted or unsubstituted phenyl group, a substituted or unsubstituted naphthyl group, —NH$_2$, —NHR, —NR$_2$, or —OR where R is phenyl or lower alkyl having from 1 to 6 carbon atoms; n is an integer from 0 to 3; and W is selected from the group consisting of CQ$_3$, substituted aromatic or heterocyclic nucleus, or

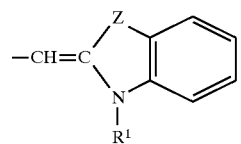

where Z is a member selected from the group consisting of oxygen or sulfur, and R$^1$ is a member selected from the group consisting of hydrogen, a lower alkyl or phenyl.

4. The photoresist composition of claim 3 where the s-triazine conforms to the formula:

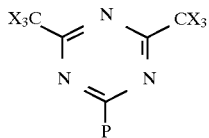

where P represents a trihalomethyl group, a substituted or unsubstituted phenyl group or a substituted or unsubstituted naphthyl group and each X may be the same or different and each represents a halogen atom.

5. The photoresist of claim 3 where X is chlorine.

6. The photoresist of claim 1 where the buffer is present in a concentration sufficient to immobilize from 1.0 to 12 mole percent of the acid generated by photolysis of the photoacid generating compound.

7. The photoresist of claim 6 where the $pK_b$ of the base varies between 1 and 3.

8. The photoresist of claim 7 where the base is a quaternary ammonium hydroxide.

9. The photoresist of claim 7 where the base is tetrabutyl ammonium hydroxide.

10. The photoresist of claim 1 where the carboxylic acid is the product of hydrolysis during storage of one of the photoresist components.

11. The photoresist of claim 1 where the carboxylic acid is lactic acid.

12. The photoresist of claim 1 where the crosslinking agent conforms to the structural formula:

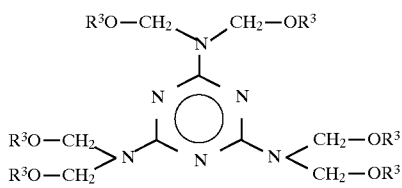

where each $R^3$ may be the same as or different and each is a member selected from the group consisting of a hydrogen atom and an alkyl group having 1 to 6 carbon atoms.

13. A process for immobilizing photogenerated acid in non-exposed regions of a negative imaged photoresist film, said method comprising providing a photoresist coating composition comprising an organic solution of an alkali soluble resin, an s-triazine photoacid generating compound that undergoes photolysis when exposed to a pattern of activating irradiation within a wavelength of from 330 to 700 nm to yield a strong hydrohalide acid, a crosslinking agent capable of crosslinking the composition when activated by photogenerated hydrohalide acid and a buffer comprising a mixture of an organic carboxylic acid and a strong base having a $pK_b$ of 5 or less, said buffer being present in a concentration sufficient to immobilize from 0.1 to 25 mole percent of the acid generated by photolysis of the s-triazine photoacid generating compound, coating said photoresist coating composition onto a substrate and drying the same, exposing the so formed photoresist coating to activating radiation within a range of from 330 to 700 nm, and baking said exposed photoresist coating to form a latent image whereby photogenerated hydrohalide acid migrating into non-exposed regions of the coating is immobilized by the buffer.

14. The process of claim 13 where the acid generated is hydrochloric acid.

15. The process of claim 13 where the s-triazine conforms to the formula:

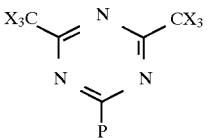

where P represents a trihalomethyl group, a substituted or unsubstituted phenyl group or a substituted or unsubstituted naphthyl group and each X may be the same or different and each represents a halogen atom.

16. The process of claim 15 where X is chlorine.

17. The process of claim 13 where the buffer is present in a concentration sufficient to immobilize from 1.0 to 12 mole percent of the acid generated by photolysis of the photoacid generating compound.

18. The process of claim 13 where the $pK_b$ of the base varies between 1 and 3.

19. The process of claim 13 where the base is a quaternary ammonium hydroxide.

20. The process of claim 19 where the base is tetrabutyl ammonium hydroxide.

21. The process of claim 13 where the carboxylic acid is the product of hydrolysis during storage of one of the photoresist components.

22. The process of claim 21 where the carboxylic acid is lactic acid.

23. The process of claim 13 where the crosslinking agent conforms to the structural formula:

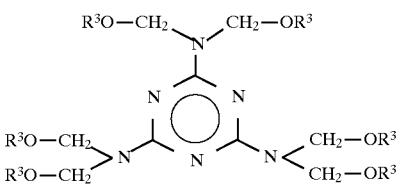

where each $R^3$ may be the same as or different and each is a member selected from the group consisting of a hydrogen atom and an alkyl group having 1 to 6 carbon atoms.

24. A negative photoresist composition consisting of an alkali soluble resin, an s-triazine photoacid generating compound that undergoes photolysis when exposed to a pattern of activating irradiation within a wavelength of from 330 to 700 nm to yield a hydrohalide strong acid, a crosslinking agent capable of crosslinking the composition when activated by photogenerated hydrohalide acid and a buffer comprising a mixture of an organic carboxylic acid formed by hydrolysis of a photoresist component during storage and a strong base having a $pK_b$ of 5 or less, said buffer being present in a concentration sufficient to immobilize from 0.1 to 25 mole percent of the acid generated by photolysis of the s-triazine photoacid generating compound.

25. A process for immobilizing photogenerated acid in non-exposed regions of a negative imaged photoresist film, said method comprising providing a photoresist coating composition comprising an organic solution of an alkali soluble resin, an s-triazine photoacid generating compound that undergoes photolysis when exposed to a pattern of activating irradiation within a wavelength of from 330 to 700 nm to yield a strong hydrohalide acid, a crosslinking agent capable of crosslinking the composition when activated by photogenerated hydrohalide acid and a buffer comprising a mixture of an organic carboxylic acid formed by hydrolysis of a photoresist component during storage and a strong base having a $pK_b$ of 5 or less, said buffer being present in a concentration sufficient to immobilize from 0.1 to 25 mole percent of the acid generated by photolysis of the s-triazine photoacid generating compound, coating said photoresist coating composition onto a substrate and drying the same, exposing the so formed photoresist coating to activating radiation within a range of from 330 to 700 nm, and baking said exposed photoresist coating to form a latent image whereby photogenerated hydrohalide acid migrating into non-exposed regions of the coating is immobilized by the buffer.

* * * * *